United States Patent [19]

Kleyner

[11] Patent Number: 5,253,147
[45] Date of Patent: Oct. 12, 1993

[54] SHOCK AND VIBRATION ISOLATION MOUNTING DEVICE HAVING SUSPENSION VIBRATION DAMPENING

[75] Inventor: Andre V. Kleyner, Indianapolis, Ind.

[73] Assignee: Delco Electronics Corporation, Kokomo, Ind.

[21] Appl. No.: 955,389

[22] Filed: Oct. 1, 1992

[51] Int. Cl.⁵ ............................................. H05K 7/02
[52] U.S. Cl. .................................. 361/807; 361/748; 361/752; 361/810; 361/724
[58] Field of Search ................ 361/391, 392, 394, 395, 361/397, 399, 412, 413, 415, 417, 420; 174/255, 50; 257/678

[56] References Cited

U.S. PATENT DOCUMENTS

| | | | |
|---|---|---|---|
| 4,070,557 | 1/1978 | Ostapovitch | 200/51.1 |
| 4,138,711 | 2/1979 | Bremenour et al. | 361/424 |
| 4,731,702 | 3/1988 | Hiatt et al. | 361/391 |
| 4,862,320 | 8/1989 | Schmidt et al. | 361/383 |
| 5,030,108 | 7/1991 | Babow et al. | 439/64 |

Primary Examiner—Leo P. Picard
Assistant Examiner—Young S. Whang
Attorney, Agent, or Firm—Cary W. Brooks

[57] ABSTRACT

A mounting device providing a mechanically stable, spring-biased, yieldable suspension for printed circuit boards, and other vibration and shock sensitive objects, with respect to an article, and also providing frictional dissipation of the energy of shock and/or vibration into heat so that suspension vibration is rapidly dampened. The mounting device according to the present invention is composed generally of a pair of T-brackets, each T-bracket has a base and a perpendicularly oriented flange medially located on the base whereby each opposite end of the printed circuit board is connected with a respective flange of the T-brackets; two pairs of S-springs, each S-spring having a pseudo "S" profile characterized by an elongatedly curved section terminating at a distal end, an acutely curved section terminating at a near end, and a moderately curved section located therebetween, wherein the distal end of each S-spring of each pair of the S-springs is connected with a respective surface of two opposing surfaces of the article and wherein the apical of the acutely curved section of each S-spring of each pair of S-springs resiliently biases against a respective base; and a pair of V-springs, each having a pseudo "V" profile characterized by an apex and a pair of feet, wherein the apex of each V-spring is connected with a respective base and the feet thereof are resiliently biased against a respective adjacent article surface.

21 Claims, 3 Drawing Sheets

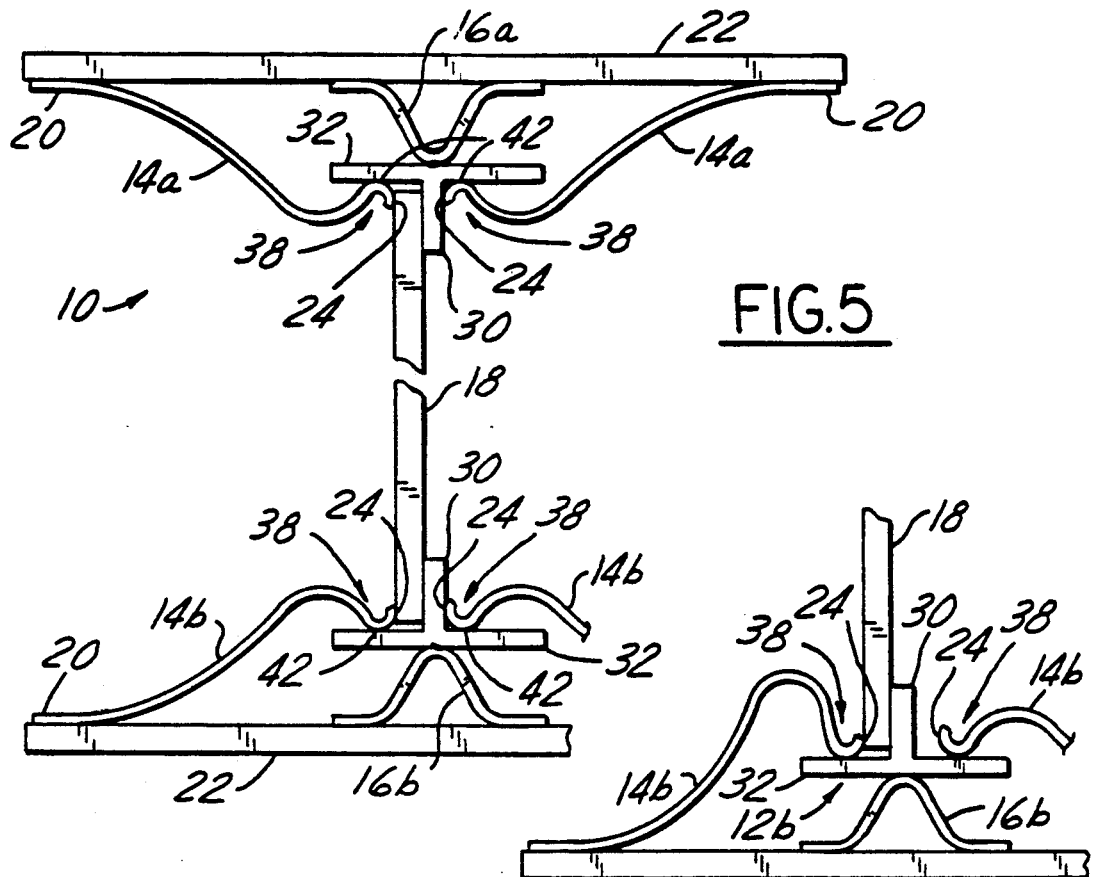
FIG.5
FIG.6
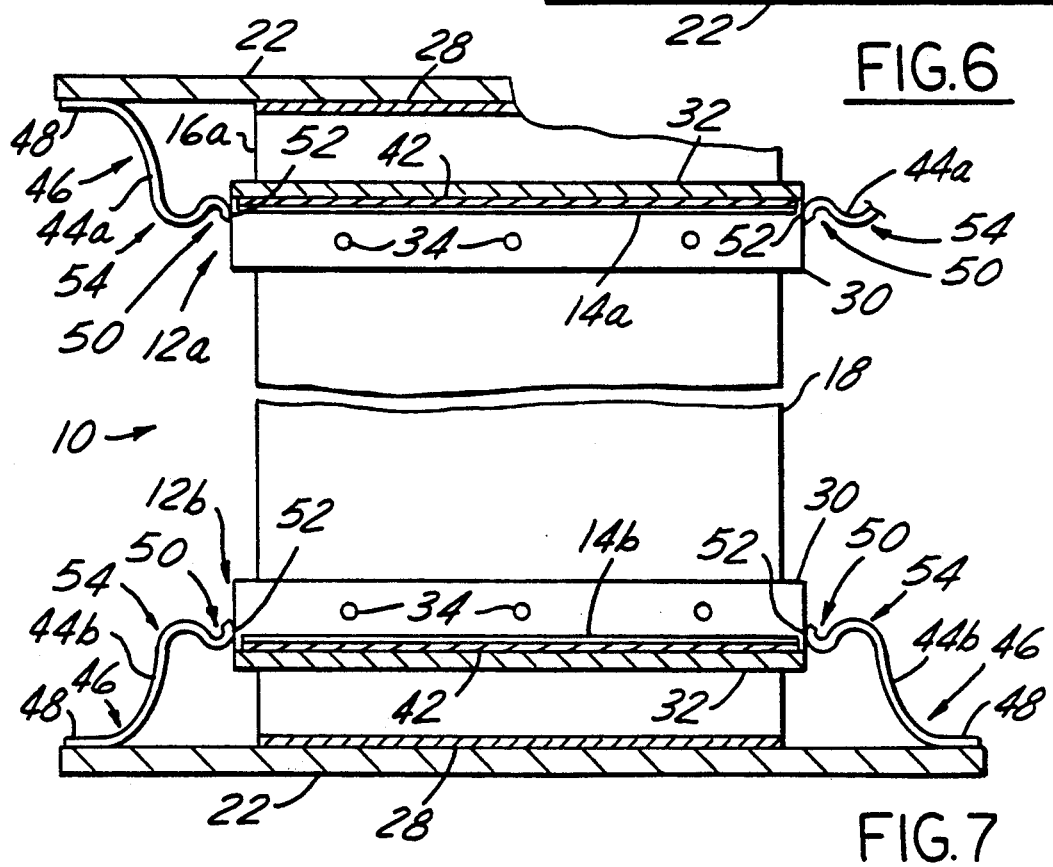
FIG.7

SHOCK AND VIBRATION ISOLATION MOUNTING DEVICE HAVING SUSPENSION VIBRATION DAMPENING

BACKGROUND OF THE INVENTION

1. Field of the Invention

The present invention is related to mounting devices for printed circuit boards and other objects sensitive to shock and vibration. More particularly, the present invention relates to a mounting device which provides resilient suspension for isolating shock and vibration, and which further provides frictional dampening for dissipating the energy associated with the shock and vibration.

2. Description of the Prior Art

With an increasing number of articles being equipped with electronic circuitry in the form of printed circuit boards, the need has commensurately increased to ensure that the related constituents thereof, the electronic components, the electrical interconnections and the substrate on which the electrical interconnections are printed, are each adequately protected from vibration and shock damage.

Typically, printed circuit boards are mechanically secured to a chassis of an article without provision for resilient mounting. As a result, in the event that shock or vibration is delivered to the article from an external source, the printed circuit board may be damaged by direct transmission thereto of the shock or vibration from the chassis.

Mounting a printed circuit board by use of a simple spring-biased suspension between it and the chassis of the article will not entirely solve the problem of protecting the printed circuit board from potential damage from shock and vibration. A major reason for this involves unstable mechanical support coupled with undesirable persistence of suspension vibration. Shock or vibration delivered by an external source to the chassis of the article will be transmitted to the spring-biased suspension resulting in suspension vibration of a particular frequency and amplitude that in time will strain the substrate of the printed circuit board, leading to its eventual failure. Another reason that a simple spring-biased mounting for a printed circuit board is not desirable is that suspension vibration will in time cause failure of the electrical leads connecting to the printed circuit board from elsewhere in the article.

Accordingly, what is needed in the art is a mounting device which provides for a mechanically stable yet yieldable suspension for printed circuit boards, and other vibration and shock sensitive objects, with respect to an article, and which also provides for dissipation of the energy of the shock and/or vibration so that suspension vibration is rapidly dampened.

SUMMARY OF THE INVENTION

The present invention is a mounting device which provides for a mechanically stable, spring-biased, yieldable suspension for printed circuit boards, and other vibration and shock sensitive objects, with respect to an article, and which also provides for frictional dissipation of the energy of the shock and/or vibration into heat so that suspension vibration is rapidly dampened.

The mounting device according to the present invention is composed generally of a pair of T-brackets, each T-bracket has a base and a perpendicularly oriented flange medially located on the base whereby each opposite end of the printed circuit board is connected with a respective flange of the T-brackets; two pairs of S-springs, each S-spring having a pseudo "S" profile characterized by an elongatedly curved section of concave orientation which terminates at a distal end, an acutely curved section of concave orientation which terminates at a near end, and a moderately curved section of convex orientation which is located therebetween, wherein the distal end of each S-spring of each pair of the S-springs is connected with a respective surface of two opposing surfaces of the article and wherein the apical of the acutely curved section of each S-spring of each pair of S-springs resiliently biases against a respective base; and a pair of V-springs, each having a pseudo "V" profile characterized by an apex and a pair of feet, wherein the apex of each V-spring is connected with a respective base and the feet thereof are resiliently biased against a respective adjacent article surface.

The mounting device according to the present invention provides for a mechanically stable support for the printed circuit board with respect to the article by each S-spring of the pairs of S-springs and the V-springs resiliently contacting their mutually respective T-brackets. Further, the V-springs and the pairs of S-springs provide a resiliently yieldable suspension along the Z axis, and the V-springs and pairs of S-springs provide a yieldable suspension along the Y axis, while the pairs of S-springs provide a predetermined amount of resiliency also along the Y axis (axis designations are indicated in FIG. 1). Further still, movement of the T-brackets with respect to the pairs of S-springs and movement of the feet of the V-springs with respect to the article results in dissipation of the energy of the suspension vibration into heat.

In operation, when shock or vibration is encountered along the Z axis, each of the V-springs will responsively deform which causes the feet thereof to slidably move in relation to their respective adjacent article surface, resulting in frictional heat dissipation of the energy of the shock or vibration. When a shock or vibration is encountered along the Y axis, the base of each T-bracket will be displaced in relation to the pairs of S-springs, resulting in frictional heat dissipation where each S-spring of the pairs of S-springs contacts its respective base, and further where the feet of each of the V-springs slidably move in relation to their respective adjacent article surface. In the event a shock or vibration is encountered partly along the Y and Z axes, both the V-springs and the pairs of S-springs will respond thereto based upon the respective axial component thereof.

Accordingly, it is an object of the present invention to provide a mounting device which stably supports a printed circuit board, or other object, with respect to an article, wherein the mounting device serves to isolate the printed circuit board from shock and/or vibration experienced by the article, and which dissipates the energy of any shock and/or vibration transmitted to the mounting device from the article.

It is an additional object of the present invention to provide a mounting device which stably supports a printed circuit board, or other object, with respect to an article, wherein the mounting device serves to isolate the printed circuit board from shock and/or vibration with respect to an article along at least two mutually perpendicular axes or a combination thereof, and which dissipates the energy of any shock and/or vibration transmitted to the mounting device from the article.

It is another object of the present invention to provide a mounting device which stably supports a printed circuit board, or other object, with respect to an article, wherein the mounting device serves to isolate the printed circuit board from shock and/or vibration with respect to an article along at least two mutually perpendicular axes or a combination thereof, and which dissipates the energy of any shock and/or vibration transmitted to the mounting device from the article by frictional interaction between the mounting device and the article.

These, and additional objects, advantages, features and benefits of the present invention will become apparent from the following specification.

BRIEF DESCRIPTION OF THE DRAWINGS

FIG. 5 is an end view of the vibration and shock isolation mounting device according to the present invention showing a variation in the mounting structure shown in FIG. 3 for providing resiliency along the Z axis.

FIG. 6 is an end view of the vibration and shock isolation mounting device according to the present invention as depicted in FIG. 5, seen responding to a shock or vibration encountered along the Y axis (the Y axis being indicated in FIG. 1).

FIG. 7 is a partly sectional front view of the vibration and shock isolation mounting device according to the present invention seen along arrows 7—7 in FIG. 2, now showing a mounting structure for providing resiliency along the X axis (the X axis being indicated in FIG. 1.)

DETAILED DESCRIPTION OF THE PREFERRED EMBODIMENT

Figure 1:
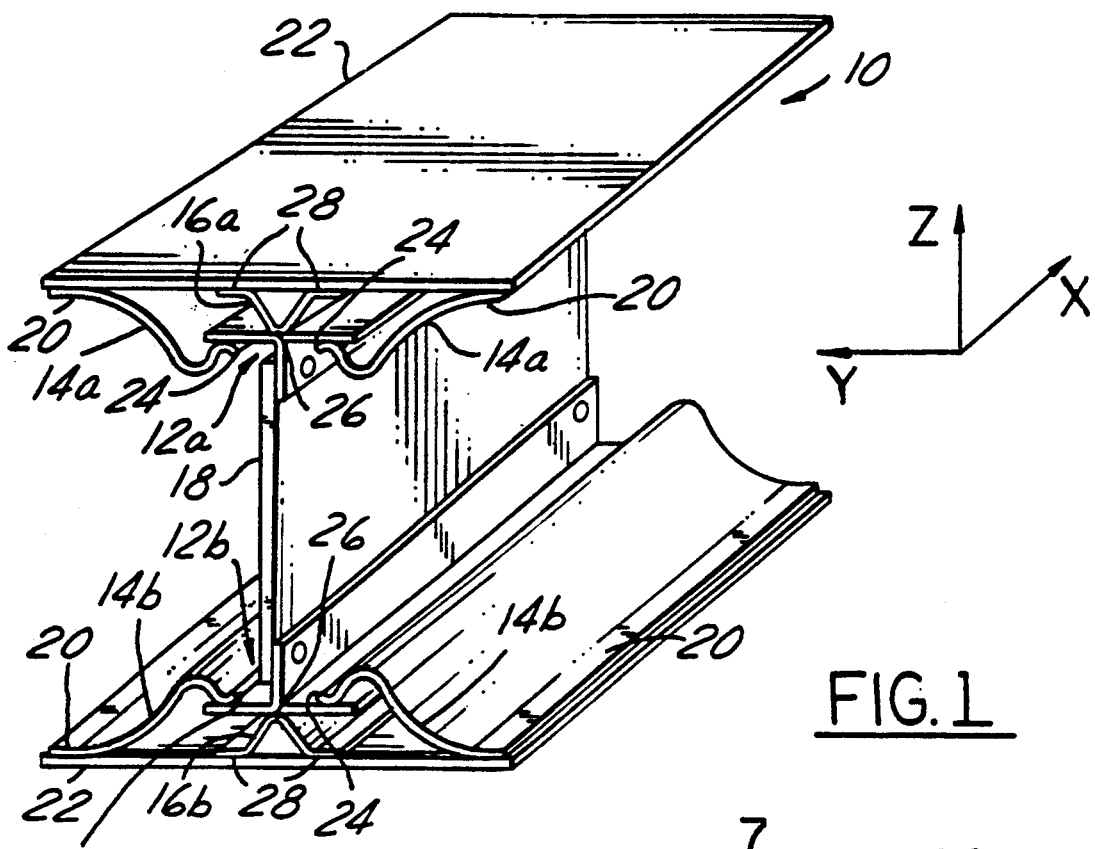
FIG. 1 is a perspective view of the vibration and shock isolation mounting device according to the present invention.

Referring now to the Drawing, an overview of the mounting device 10 according to the present invention can be understood by reference to FIG. 1. In this regard, the mounting device 10 is composed generally of first and second T-brackets 12a, 12b; a first pair of S-springs 14a, one S-spring thereof being located on either side of first T-bracket 12a and a second pair of S-springs 14b, one S-spring thereof being located on either side of second T-bracket 12b; and first and second V-springs 16a, 16b. A printed circuit board 18 is connected at either end thereof respectively with the first and second T-brackets 12a, 12b. The distal end 20 of each S-spring of each pair of S-springs 14a, 14b is connected (such as, for example, by rivets or welding) with a chassis 22 which forms a part of an article, and first and second T-brackets 12a, 12b abut the S-springs of respective pairs of S-springs 14a, 14b adjacent the near end 24 thereof. The apex 26 of each of the first and second V-springs 16a, 16b is connected (such as, for example, by welding) to a respective one of the first and second T-brackets 12a, 12b, while the feet 28 thereof abut a respective adjacent surface of two opposing surfaces of the chassis 22.

Accordingly, the printed circuit board 18 is held in a mechanically stable manner with respect to the chassis 22, yet when vibration or shock is encountered by the chassis 22, transmission therefrom to the printed circuit board 18 is isolated by the pre-selected resiliency of the first and second pairs of S-springs 14a, 14b and of the first and second V-springs 16a, 16b, while sliding movement thereof with respect to respective first and second T-brackets 12a, 12b and the respective adjacent surfaces of the chassis 22 results in suspension vibration dampening due to frictional heat production.

Figure 2:
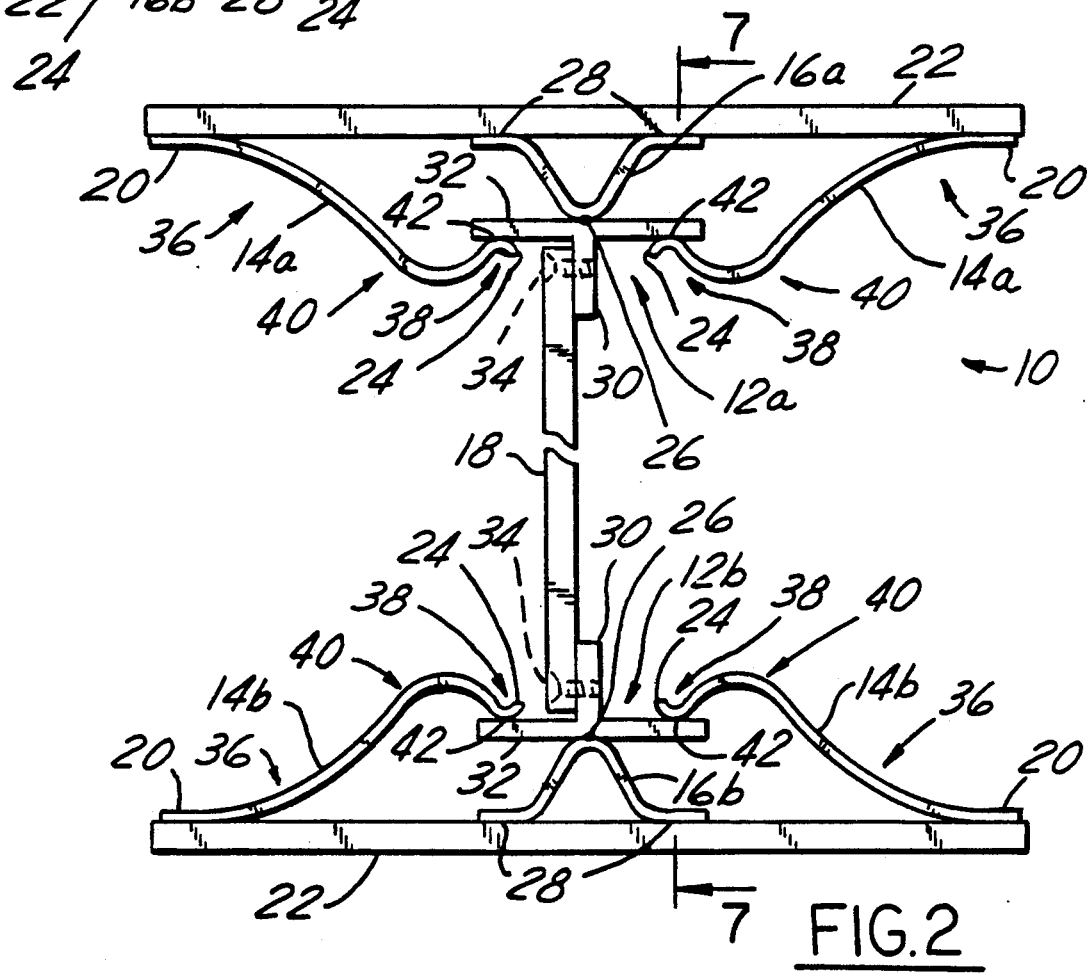
FIG. 2 is an end view of the vibration and shock isolation mounting device according to the present invention.
Figure 3:
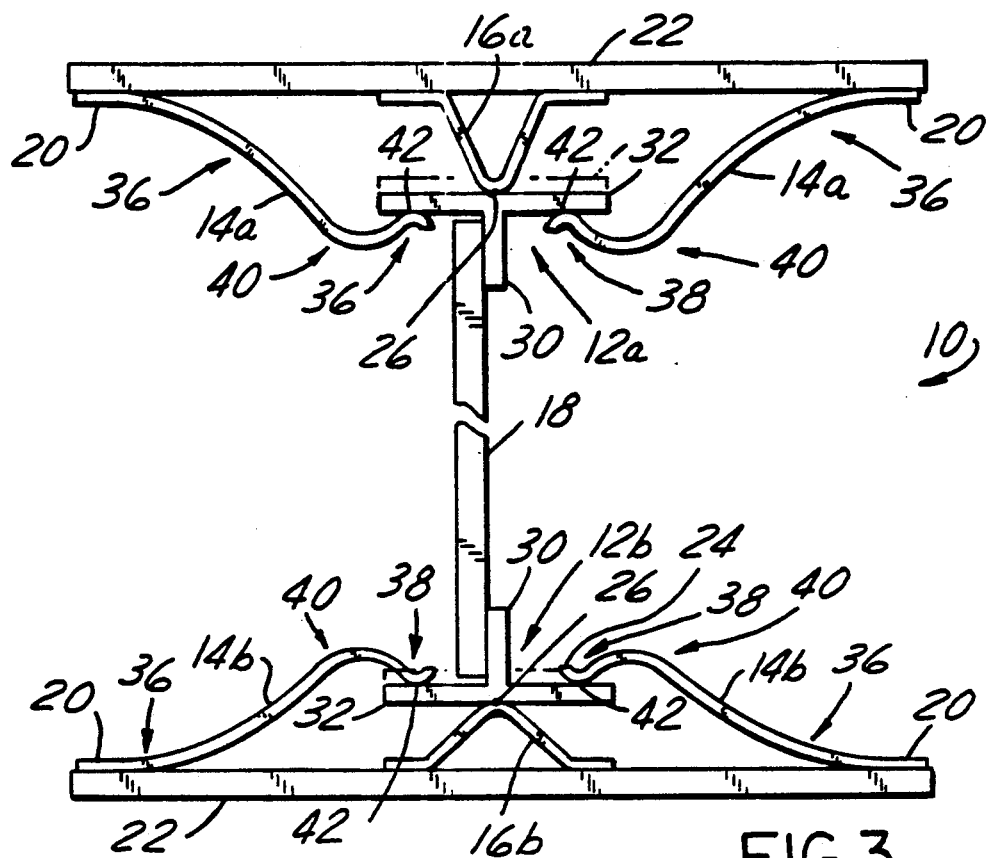
FIG. 3 is an end view of the vibration and shock isolation mounting device according to the present invention, seen responding to a shock or vibration encountered along the Z axis (the Z axis being indicated in FIG. 1).
Figure 4:
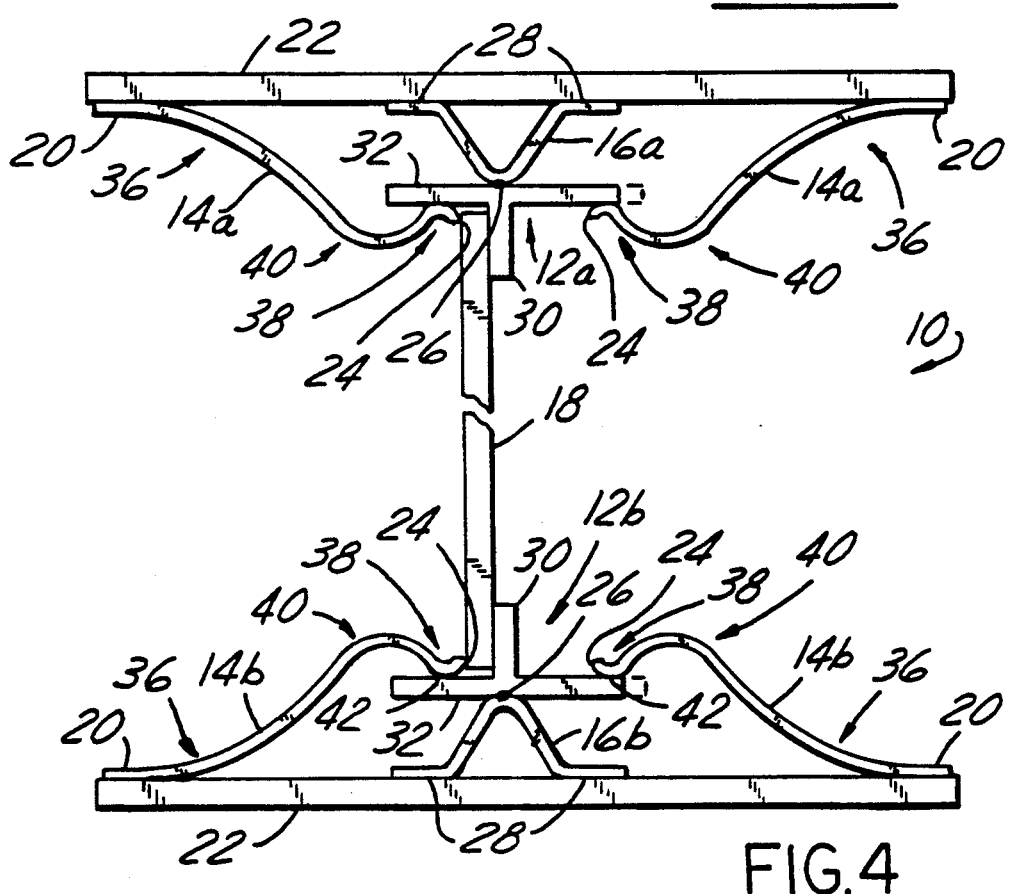
FIG. 4 is an end view of the vibration and shock isolation mounting device according to the present invention, seen responding to a shock or vibration encountered along the Y axis (the Y axis being indicated in FIG. 1).

A more detailed explanation of the structure and operation of the mounting device 10 will next be undertaken with reference now being had to FIGS. 2 through 4.

Each T-bracket 12a, 12b is composed of a flange 30 medially located on, and connected perpendicular to, a base 32. The printed circuit board 18 is connected at opposite ends thereof to the flange 30 of respective first and second T-brackets 12a, 12b, wherein one end of the printed circuit board is connected to the flange 30 of the first T-bracket 12a, while the opposite end of the printed circuit board is connected to the flange 30 of the second T-bracket 12b. A preferred connection of the printed circuit board 18 to the flange 30 of each of the first and second T-brackets 12a, 12b is via threaded fasteners 34, but any other suitable connection means known in the mechanical arts can be used.

Each S-spring of each the first and second pairs of S-springs 14a, 14b has a pseudo "S" profile characterized by an elongatedly curved section 36 of concave orientation which terminates at the distal end 20, an acutely curved section 38 of concave orientation which terminates at the near end 24, and a moderately curved section 40 of convex orientation which is located therebetween. The distal end 20 of each S-spring of the first pair of S-springs 14a is connected with a first surface of the chassis 22, while the distal end 20 of each S-spring of the second pair of S-springs 14b is connected with an opposing second surface of the chassis 22, which is spaced from and parallel with the first surface. Adjacent the near end 24 of each of the S-springs of the first pair of S-springs 14a, the apical 42 of the acutely curved section 38 thereof resiliently biases against the base 32 of the first T-bracket 12a, one S-spring being located on each side of the flange 30 thereof. Adjacent the near end 24 of each of the S-springs of the second pair of S-springs 14b, the apical 42 of the acutely curved section 38 thereof resiliently biases against the base 32 of the second T-bracket 12b, one S-spring being located on each side of the flange 30 thereof.

As can be seen from FIGS. 1 through 4, the first and second T-brackets 12a, 12b are slidable relative to the pairs of S-springs 14a, 14b without the appearance of resilient biasing with respect thereto for a predetermined amount of sliding. This is accomplished by the near end 24 of each S-spring of the first and second pairs of S-springs that are located on a common side of the flange 30 of each of the first and second T-brackets (i.e., the left side or the right side thereof in FIG. 2) being spaced a first preselected distance from the respective flanges, and by the near end 24 of each S-spring of the first and second pairs of S-springs that are located on the other common side of the flange 30 of respective first and second T-brackets being spaced a second preselected distance from the respective flanges. The first and second predetermined distances may or may not be the same.

Each of the first and second V-springs 16a, 16b has a pseudo "V" profile characterized by the aforesaid apex 26, and the aforesaid pair of feet 28, wherein one foot is located on either side of the apex. The apex 26 of the first V-spring 16a is connected with the base 32 of the first T-bracket 12a directly opposite the flange 30 thereof, while the apex 26 of the second V-spring 16b is connected with the base 32 of the second T-bracket 12b directly opposite the flange 30 thereof. The feet 28 of the first V-spring 16a resiliently bias against the adjacent first surface of the chassis 22, while the feet 28 of the second V-spring 16b resiliently bias against the adjacent second surface of the chassis 22, which, as mentioned above, is situated directly opposite and parallel to the first surface.

Operationally, from the foregoing structural description it is clear that the first and second V-springs 16a, 16b support the printed circuit board 18, via the first and second T-brackets 12a, 12b, with respect to the chassis 22 along the Z axis. In addition, as shown in FIG. 3, the first and second V-springs 16a, 16b are resiliently deformable with a predetermined spring constant so as to springably deform along the Z axis in response to shocks and vibrations externally delivered to the chassis 22. In the process of deforming, the feet 28 of each of the first and second V-springs 16a, 16b will slide along respectively adjacent surfaces of the chassis 22. This sliding results in frictional heat production which serves to dampen suspension vibration along the Z axis as spring energy is converted to heat. The first and second pairs of S-springs 14a, 14b will also deform along the Z axis, aiding in providing resiliency therealong based upon the predetermined spring constant thereof.

Operationally further, from the foregoing structural description it is clear that the first and second T-brackets 12a, 12b may slide with respect to the near end 24 of the S-springs of respective first and second pairs of S-springs 14a, 14b. As indicated in FIG. 4, the base 32 of the first and second T-brackets 12a, 12b will slide respectively against the apical 42 of the acutely curved section 38 of the S-springs of each of the first and second pairs of S-springs 14a, 14b. This sliding results in frictional heat production which converts shock and vibration energy into heat and thereby serves to dampen suspension vibration with respect to the chassis 22 along the Y axis. Additionally, as each of the first and second T-brackets 12a, 12b slide, the feet 28 of each of the first and second V-springs 16a, 16b will slide with respect to the respective adjacent surfaces of the chassis, thereby providing frictional heat production which further serves to dampen suspension vibration with respect to the chassis along the Y-axis. In the event the flange 30 of each of the first and second T-brackets 12a, 12b (and the printed circuit board 18) has slid so as to now abut the near end 24 of one of the S-springs of each of the first and second pairs of S-springs 14a, 14b, the abutting S-springs will deform resiliently in response to further sliding movement of the first and second T-brackets (as generally shown in FIG. 6).

Accordingly, the mounting device 10 provides a mechanically stable yet yieldable and selectively resilient support for the printed circuit board 18 with respect to the chassis 22 as a result of the combination of each of the first and second T-brackets 12a, 12b, the first and second V-springs 16a, 16b connected respectively thereto, and the location of the apical 42 of each of the S-springs of the first and second pairs of S-springs 14a, 14b with respect to either side of the respective one of the first and second V-springs.

Referring now to FIGS. 5 and 6, an optional variation in the structure of the mounting device 10 is shown. It will be discerned that the near end 24 of each S-spring of each of the first and second pairs of S-springs 14a, 14b respectively abuts the flange 30 of respective first and second T-brackets 12a, 12b (or abuts the printed circuit board 18). As shown in FIG. 6, when a shock or vibration is delivered to the chassis 22 having a Y axis component, the first and second T-brackets 12a, 12b bias against the near end of each S-spring located on one side of each flange 30, resulting in springable deformation thereof. This structure affords a resilient restoring bias which tends to keep the flange 30 of each of the first and second T-brackets 12a, 12b centered on a predetermined location with respect to the chassis 22. Suspension vibration damping by operation of frictional heat dissipation transpires as described hereinabove.

Referring now to FIG. 7, an optional structural aspect of the mounting device 10 for providing resilient response to shocks and vibrations delivered to the chassis 22 having an X axis component is depicted. In this regard, first and second pairs of auxiliary S-springs 44a, 44b are provided. As with the S-springs of the first and second pairs of S-springs 14a, 14b discussed hereinabove, each auxiliary S-spring of each first and second auxiliary pair of S-springs 44a, 44b is characterized by an elongatedly curved portion 46 of concave orientation which terminates in a remote end 48, an acutely curved portion 50 of concave orientation which terminates in a proximate end 52, and a moderately curved portion 54 of convex orientation which is located therebetween. The remote end 48 of each auxiliary S-spring of each of the first and second pairs of auxiliary S-springs 44a, 44b is connected with respective first and second surfaces of the chassis 22, and the proximate end 52 thereof abuts the flange 30 of a respective first and second T-bracket 12a, 12b (or alternatively the printed circuit board 18), one auxiliary S-spring being located on mutually opposite ends thereof.

When a shock or vibration affecting the chassis has an X axis component, one or the other auxiliary S-springs of the first and second pairs of auxiliary S-springs 44a, 44b will resiliently deform based upon a predetermined spring constant thereof, analogously to that depicted in FIG. 6 with respect to the two pairs of S-springs 14a, 14b. As the first and second T-brackets 12a, 12b move in response to the aforesaid deformation of the subject auxiliary S-springs of the first and second pairs of auxiliary S-springs 44a, 44b, the feet 28 of each of the first and second V-springs 16a, 16b will slide against the respective adjacent surfaces of the chassis 22, while attendantly, the apical 42 of the acutely curved section 38 of the S-springs of the first and second pairs of S-springs 14a, 14b will slide on the base 32 of the respective first and second T-brackets 12a, 12b, each of which resulting in dampening of the suspension vibration along the X axis due to frictional heat generation.

To those skilled in the art to which this invention appertains, the above described preferred embodiment may be subject to change or modification. Such change or modification can be carried out without departing from the scope of the invention, which is intended to be limited only by the scope of the appended claims.

What is claimed is:

1. A mounting device for mounting an object to an article, the object having a first end and an opposite second end, the article having a first surface and an opposite second surface parallel with said first surface and spaced a predetermined distance from said first surface, said mounting device comprising:

first T-bracket means for providing connection to a first end of the object and for providing a first base;

second T-bracket means for providing connection to a second end of the object opposite said first end thereof and for providing a second base;

first S-spring means connected to the first surface for resiliently biasing against said first base toward the first surface, wherein said first T-bracket means is slidable relative to said first S-spring means;

second S-spring means connected to the second surface for resiliently biasing against said second base toward the second surface, wherein said second T-bracket means is slidable relative to said second S-spring means;

first V-spring means connected with said first T-bracket means for providing resilient contact between said first T-bracket means and the first surface, wherein said first V-spring means slides relative to the first surface when compressed between said first T-bracket means and the first surface; and second V-spring means connected with said second T-bracket means for providing resilient contact between said second T-bracket means and the second surface, wherein said second V-spring means slides relative to the second surface when compressed between said second T-bracket means and the second surface;

wherein the predetermined distance is such that said first V-spring means resiliently biases against the first surface and simultaneously said second V-spring means resiliently biases against the second surface.

2. The mounting device of claim 1, further comprising:

first flange means connected with said first base directly opposite said first V-spring means for connecting with the first end of the object; and second flange means connected with said second base directly opposite said second V-spring means for connecting with the second end of the object;

wherein said first S-spring means provides resilient biasing on each side of said first flange means; and wherein said second S-spring means provides resilient biasing on each side of said second flange means.

3. The mounting device of claim 2, wherein the object is a printed circuit board.

4. The mounting device of claim 2, wherein each of said first and second T-bracket means has a pair of mutually opposite ends, said mounting device further comprising:

first auxiliary S-spring means connected with said first surface for resiliently biasing with respect to each end of said pair of mutually opposite ends of said first T-bracket means; and second auxiliary S-spring means connected with said second surface for resiliently biasing with respect to each end of said pair of opposite ends of said second T-bracket means.

5. The mounting device of claim 4, wherein the object is a printed circuit board.

6. The mounting device of claim 2, wherein said first and second S-spring means selectively resiliently bias said first and second T-bracket means along an axis parallel with the first and second surfaces so that said first and second T-bracket means are biased toward a predetermined position with respect to the article.

7. The mounting device of claim 6, wherein the object is a printed circuit board.

8. The mounting device of claim 7, wherein each of said first and second T-bracket means has a pair of mutually opposite ends, said mounting device further comprising:

first auxiliary S-spring means connected with the first surface for resiliently biasing with respect to each end of said pair of mutually opposite ends of said first T-bracket means; and second auxiliary S-spring means connected with said second surface for resiliently biasing with respect to each end of said pair of mutually opposite ends of said second T-bracket means.

9. The mounting device of claim 8, wherein the object is a printed circuit board.

10. A mounting device for mounting an object to an article, the object having a first end and an opposite second end, the article having a first surface and an opposite second surface parallel with said first surface and spaced a predetermined distance from said first surface, said mounting device comprising:

a first T-bracket, said first T-bracket comprising:
    a first base; and
    a first flange connected to said first base at a medial location thereon, said first flange being perpendicularly oriented with respect to said first base;

a second T-bracket, said second T-bracket comprising:
    a second base; and
    a second flange connected to said second base at a medial location thereon, said second flange being perpendicularly oriented with respect to said second base, wherein said first and second flanges are oriented toward each other;

a first pair of S-springs, one S-spring thereof being located on each side of said first flange;

a second pair of S-springs, one S-spring thereof being located on each side of said second flange, each S-spring of said first and second pairs of S-springs comprising:

an acutely curved section having a concave orientation, said acutely curved section terminating in a near end thereof, said acutely curved section having an apical;

an elongated curved section having a concave orientation, said elongatedly curved section terminating in a distal end thereof; and a moderately curved section having a convex orientation, said moderately curved section being located between said acutely curved section and said elongatedly curved section;

a first V-spring having a first apex and a first pair of feet, one foot thereof being located on either side of said first apex, said first apex being connected with said first base directly opposite said first flange; and a second V-spring having a second apex and a second pair of feet, one foot thereof being located on either side of said second apex, said second apex being connected with said second base directly opposite said second flange;

wherein the predetermined distance is such that said first pair of feet resiliently bias against the first surface and said second pair of feet resiliently bias against the second surface; wherein said distal end of each S-spring of said first pair of S-springs is connected to said first surface, said apical of each said S-spring of said first pair of S-springs resiliently biasing on said first base such that said first base is slidable relative thereto, one apical of said first pair of S-springs being located on each side of said first flange; and wherein said distal end of each S-spring of said second pair of S-springs is connected to said second surface, said apical of each said S-spring of said second pair of S-springs resiliently biasing on said second base such that said second base is slidable relative thereto, one apical of said second pair of S-springs being located on each side of said second flange.

11. The mounting device of claim 10, wherein the object is a printed circuit board.

12. The mounting device of claim 10, wherein each of said first and second T-brackets have mutually opposite ends, said mounting device further comprising:
a first pair of auxiliary S-springs, one auxiliary S-spring thereof being located at each end of said mutually opposite ends of said first T-bracket; and
a second pair of auxiliary Ssprings, one auxiliary S-spring thereof being located at each end of said mutually opposite ends of said second T-bracket, each auxiliary S-spring of said first and second pairs of auxiliary S-springs comprising:
an acutely curved portion having a concave orientation, said acutely curved portion terminating in a proximate end thereof;
an elongatedly curved portion having a concave orientation, said elongatedly curved portion terminating in a remote end thereof; and
a moderately curved portion having a convex orientation, said moderately curved portion being located between said acutely curved portion and said elongatedly curved portion;
wherein said remote end of each auxiliary S-spring of said first pair of auxiliary S-springs is connected to the first surface, said near end of each said auxiliary S-spring of said first pair of auxiliary S-springs resiliently biasing against at least one of a respective end of said mutually opposite ends of said first T-bracket and the object; and wherein said remote end of each auxiliary S-spring of said second pair of auxiliary S-springs is connected to the second surface, said near end of each said auxiliary S-spring of said second pair of auxiliary S-springs resiliently biasing against at least one of a respective end of said mutually opposite ends of said second T-bracket and the object.

13. The mounting device of claim 12, wherein the object is a printed circuit board.

14. The mounting device of claim 10, wherein said near end of each S-spring of said first and second pairs of S-springs which is located on a common side of each of said first and second flanges is spaced a first preselected distance therefrom, and said near end of each S-spring of said first and second pairs of S-spring which is located on the other common side of said first and second flanges is spaced a second preselected distance therefrom.

15. The mounting device of claim 14, wherein the object is a printed circuit board.

16. The mounting device of claim 14, wherein each of said first and second T-brackets have mutually opposite ends, said mounting device further comprising:
a first pair of auxiliary S-springs, one auxiliary S-spring thereof being located at each end of said mutually opposite ends of said first T-bracket; and
a second pair of auxiliary S-springs, one auxiliary S-spring thereof being located at each end of said mutually opposite ends of said second T-bracket, each auxiliary S-spring of said first and second pairs of auxiliary S-springs comprising:
an acutely curved portion having a concave orientation, said acutely curved portion terminating in a proximate end thereof;
an elongatedly curved portion having a concave orientation, said elongatedly curved portion terminating in a remote end thereof; and
a moderately curved portion having a convex orientation, said moderately curved portion being located between said acutely curved portion and said elongatedly curved portion;
wherein said remote end of each auxiliary S-spring of said first pair of auxiliary S-springs is connected to the first surface, said near end of each said auxiliary S-spring of said first pair of auxiliary S-springs resiliently biasing against at least one of a respective end of said mutually opposite ends of said first T-bracket and the object; and wherein said remote end of each auxiliary S-spring of said second pair of auxiliary S-springs is connected to the second surface, said near end of each said auxiliary S-spring of said second pair of auxiliary S-springs resiliently biasing against at least one of a respective end of said mutually opposite ends of said second T-bracket and the object.

17. The mounting device of claim 16, wherein the object is a printed circuit board.

18. The mounting device of claim 10, wherein said near end of each said S-spring of said first pair of S-springs selectively biases against at least one of said first flange and said object, and said near end of each said S-spring of said second pair of S-springs selectively biases against at least one of said second flange and said object so that said first and second T-brackets are biased along an axis parallel with the first and second surfaces toward a predetermined position with respect to the article.

19. The mounting device of claim 18, wherein the object is a printed circuit board.

20. The mounting device of claim 18, wherein each of said first and second T-brackets have mutually opposite ends, said mounting device further comprising:
a first pair of auxiliary S-springs, one auxiliary S-spring thereof being located at each end of said mutually opposite ends of said first T-bracket; and
a second pair of auxiliary S-springs, one auxiliary S-spring thereof being located at each end of said mutually opposite ends of said second T-bracket, each auxiliary S-spring of said first and second pairs of auxiliary S-springs comprising:
an acutely curved portion having a concave orientation, said acutely curved portion terminating in a proximate end thereof;

an elongatedly curved portion having a concave orientation, said elongatedly curved portion terminating in a remote end thereof; and a moderately curved portion having a convex orientation, said moderately curved portion being located between said acutely curved portion and said elongatedly curved portion;

wherein said remote end of each auxiliary S-spring of said first pair of auxiliary S-springs is connected to the first surface, said near end of each said auxiliary S-spring of said first pair of auxiliary S-springs resiliently biasing against at least one of a respective end of said mutually opposite ends of said first T-bracket and the object; and wherein said remote end of each auxiliary S-spring of said second pair of auxiliary S-springs is connected to the second surface, said near end of each said auxiliary S-spring of said second pair of auxiliary S-springs resiliently biasing against at least one of a respective end of said mutually opposite ends of said second T-bracket and the object.

21. The mounting device of claim 20, wherein the object is a printed circuit board.

* * * * *